United States Patent [19]

Cho et al.

[11] Patent Number: 5,148,399
[45] Date of Patent: Sep. 15, 1992

[54] SENSE AMPLIFIER CIRCUITRY SELECTIVELY SEPARABLE FROM BIT LINES FOR DYNAMIC RANDOM ACCESS MEMORY

[75] Inventors: Shizuo Cho; Junichi Suyama, both of Tokyo, Japan

[73] Assignee: OKI Electric Industry Co., Ltd., Tokyo, Japan

[21] Appl. No.: 709,808

[22] Filed: May 31, 1991

Related U.S. Application Data

[63] Continuation of Ser. No. 372,880, Jun. 28, 1989, abandoned.

[30] Foreign Application Priority Data

Jun. 28, 1988 [JP] Japan ................................ 63-159768

[51] Int. Cl.⁵ .......................................... G11C 11/407
[52] U.S. Cl. .................................... 365/205; 365/190; 365/233
[58] Field of Search ................ 365/190, 205, 207, 208, 365/233, 203; 307/530

[56] References Cited

U.S. PATENT DOCUMENTS

| | | | |
|---|---|---|---|
| 4,262,341 | 4/1981 | Mogi et al. | 365/207 |
| 4,710,901 | 12/1987 | Kumanoya et al. | 365/190 |
| 4,739,500 | 4/1988 | Miyamoto et al. | 365/207 |
| 4,799,197 | 1/1989 | Kodama et al. | 365/205 |
| 4,803,663 | 2/1989 | Miyamoto et al. | 365/205 |
| 4,816,706 | 3/1989 | Dhong et al. | 365/205 |
| 4,829,483 | 5/1989 | Ogihara | 365/203 |
| 4,931,992 | 6/1990 | Ogihara et al. | 365/205 |
| 4,980,863 | 12/1990 | Ogihara | 365/205 |

OTHER PUBLICATIONS

Heller et al., "High Sensitivity Charge-Transfer Sense Amplifier", IEEE Jour. of Solid St. Ccts. vol. SC-11, No. 5, Oct. 1976, pp. 596-601.

Masahiro Yoshida, et al., "The Analysis of CMOS Sense Amplifier" National Convention Record, No. 528, The Institute of Electronics and Comm. Engineers of Japan, Mar. 27-30, 1985, pp. 2-246.

Primary Examiner—Glenn Gossage
Attorney, Agent, or Firm—Edward D. Manzo

[57] ABSTRACT

An integrated circuit memory device includes a sense amplifier circuit having a first transistor coupling section connected between a pair of bit lines and a pair of sense amplifier nodes. The first transistor coupling section selectively connects the bit lines and the sense amplifier nodes in response to a first control signal. The sense amplifier circuit further includes a first sense amplifier connected between the sense amplifier nodes so as to selectively discharge one of the sense amplifier nodes and a second sense amplifier connected between the sense amplifier nodes so as to selectively charge the other one of the sense amplifier nodes. The first control signal can have a first voltage substantially intermediate a potential equal to a potential threshold of a transistor in the first transistor coupling section and the sum of a potential equal to the potential threshold and a precharge potential at the beginning of a sense operation. At these voltage levels, the first transistor is operative to decouple a first sense node from a first bit line when a selected memory cell stores a logic ONE level while a second transistor connects a second sense node with as second bit line. Also, the second transistor is operative to decouple the second sense node from the second bit line when the selected memory cell stores a logic ZERO level while the first transistor connects the first sense node with the first bit line.

11 Claims, 4 Drawing Sheets

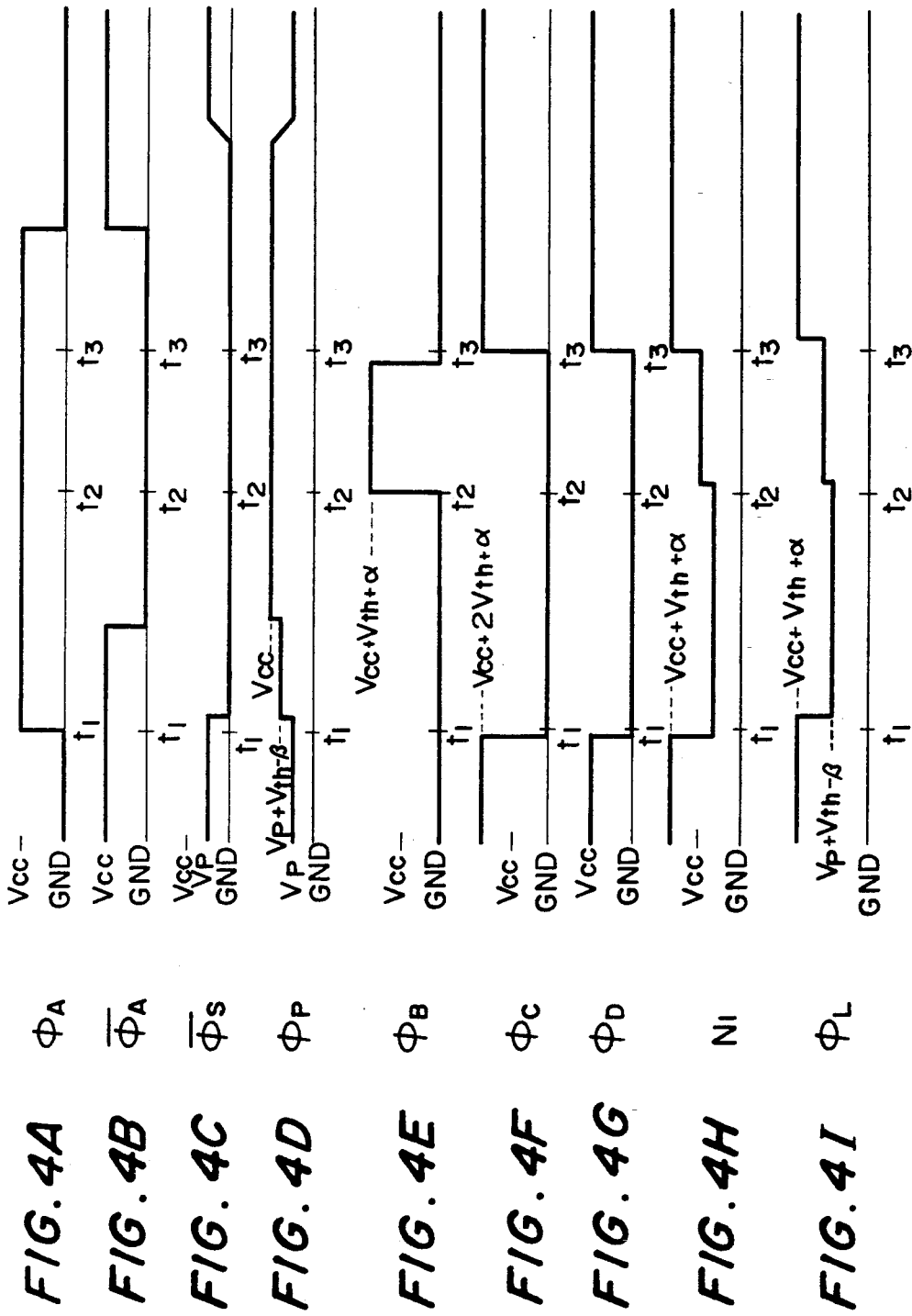

SENSE AMPLIFIER CIRCUITRY SELECTIVELY SEPARABLE FROM BIT LINES FOR DYNAMIC RANDOM ACCESS MEMORY

This is a continuation of copending application(s) Ser. No. 07/372,880 filed on Jun. 28, 1989, now abandoned.

BACKGROUND OF THE INVENTION

1. Field of the Invention

The present invention relates to a dynamic random access memory (RAM), and in particular to improved sense amplifier circuitry for sensing data stored in the memory.

2. Description of the Prior Art

A dynamic RAM in which memory cells are integrated into high packing density for a large memory capacity is an important feature to improve the control and operational functions of electronic appliances and to reduce the size thereof. However, in order to manufacture a dynamic RAM ("DRAM") of this type to the desired characteristics, various kinds of technology are required to be developed. This also applies to the technology required to increase the operation speed of the sense amplifier. Consequently, various types of DRAMs associated with sense amplifiers configured according to new designs and ideas has been proposed.

As well known, a MOS DRAM, for example, includes a memory cell array in the form of columns such that each array has memory cells arranged between a pair of bit lines and a plurality of word lines intersecting the bit lines, with each memory cell connected between one of the word lines and one of the bit lines.

In order to implement a high-speed access and a low power consumption for a DRAM of this construction there has been a tendency to employ complementary MOS (CMOS) technology. In association therewith, the sense amplifier circuitry is also formed in the CMOS structure. For example, in "the Analysis of CMOS Sense Amplifier" written by M. Yoshida in the National Convention Record, 1985 of the Institute of Electronics and Communication Engineers of Japan, No. 528 (Mar. 27–30, 1985), the author described an analysis on operations of a CMOS sense amplifier according to a bit-line half-precharge method. In this method, two bit lines constituting a bit line pair are connected to each other to form a short circuit there-between, so as to attain an average of a high-level voltage and a low-level voltage of the previous operating cycle, thereby setting the average as a precharge potential level for the bit lines. This precharge potential level is substantially intermediate or approximately halfway between (thus, a "half-precharge" method) a power source potential (Vcc, for example) and a ground potential.

This type of sense amplifier circuit has two sense amplifiers connected between a pair of bit lines such that one of the sense amplifiers is a sense amplifier including an n-type channel comprising a pair of MOS transistors having n-type channels in which control gates are crosswise connected. The other sense amplifier is a sense amplifier including a p-type channel comprising a pair of MOS transistors having p-type channels in which control gates are also crosswise connected. In a read operation of the memory cell, these sense amplifiers are supplied with complementary read clocks in complementary phases to each other. The paired bit lines are linked via a switching circuit including a pair of transistors to a pair of data buses. The switching circuit undergoes a switching operation under the control of a column decoder.

However, in a case where the DRAM structure above is applied to a memory of a large capacity, a problem arises that at a time when the sense amplifier is enabled, due to a large capacitance of the bit line, a long period of time is required for the sense amplifier to conduct charge/discharge operations on the bit line for the sense operation. Furthermore, in a case of a configuration in which the electrostatic capacity of the data bus is greater than that of the paired bit lines selected by the column decoder, there occurs an additional problem that, in an operation to select a column line, the potential difference between the paired bit lines is decreased, which elongates the period of time to transmit data to the data bus. Consequently, it is a problem to implement a DRAM to be driven for a high-speed access.

SUMMARY OF THE INVENTION

It is therefore an object of the present invention to provide sense amplifier circuitry capable of driving a DRAM with a high-speed access time.

In accordance with the present invention, sense amplifier circuit for a dynamic random access memory comprises a first transistor coupling circuit connected between a pair of bit lines and a pair of sense amplifier nodes with, each bit line being connected to a memory cell to constitute a column, so as to selectively set a path between the bit lines and the sense amplifier nodes to a conductive state in response to a first control signal. A first sense circuit is connected between a pair of sense amplifier nodes to selectively discharge one of the sense amplifier nodes in response to a second control signal. A second sense circuit is connected between a pair of sense amplifier nodes to selectively charge the other sense amplifier node in response to a third control signal.

BRIEF DESCRIPTION OF THE DRAWINGS

The objects and features of the present invention will become more apparent from the consideration of the following detailed description taken in conjunction with the accompanying drawings in which:

FIGS. 4A–4I are waveforms useful for understanding the operation of the $\phi$ L signal generator circuit of FIG. 3.

DESCRIPTION OF THE PREFERRED EMBODIMENT

Figure 1:
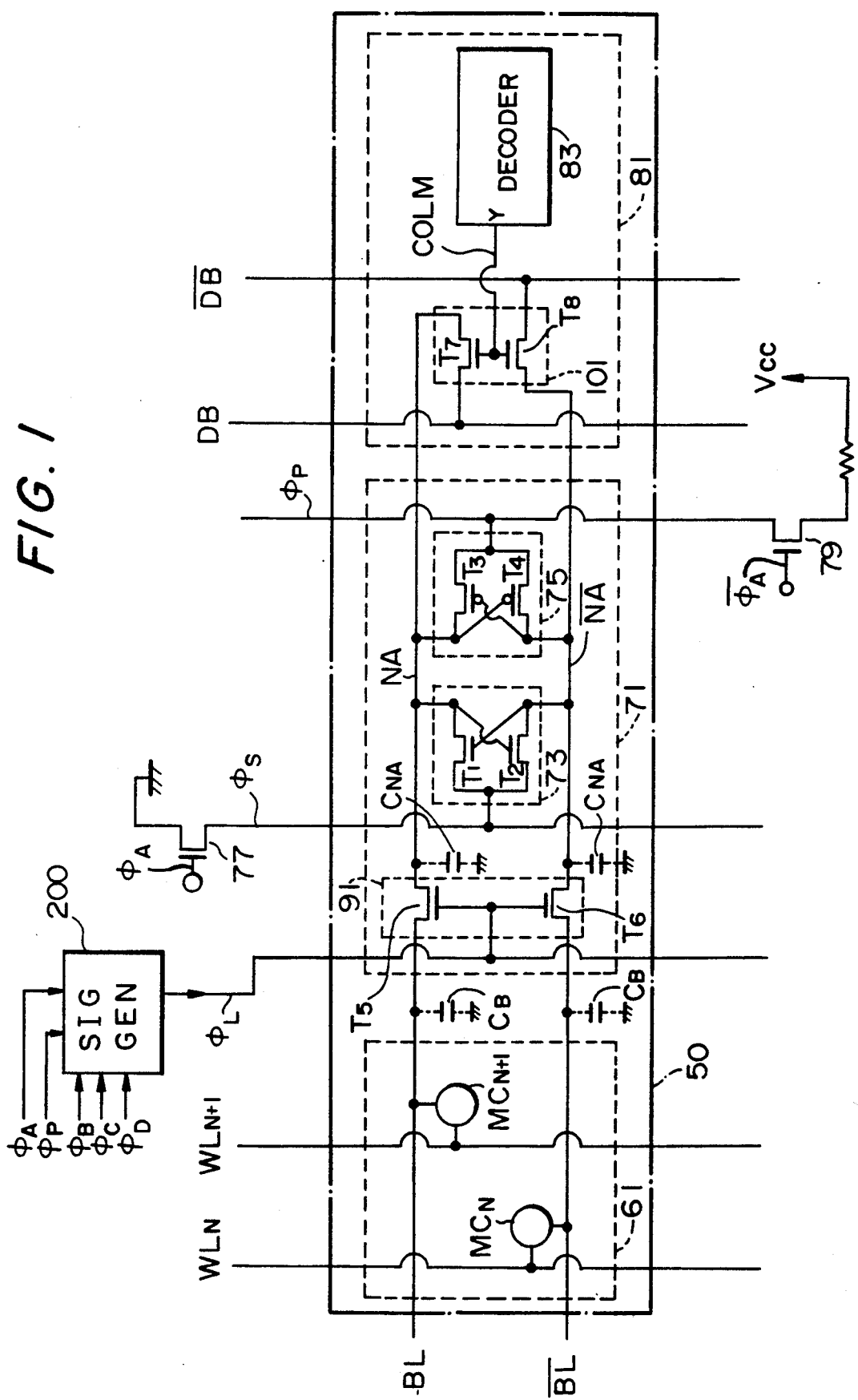
FIG. 1 is a circuit diagram schematically showing a constitution of an embodiment in which a sense amplifier circuit according to the present invention is applied to a DRAM.

Referring now to the accompanying drawings, a description will be given of an embodiment of a dynamic RAM (DRAM) according to the present invention. The embodiment is only schematically shown in the drawings for an easy understanding of the present invention and hence it is to be understood that the present invention is not restricted to only the examples shown in the drawings.

DESCRIPTION OF CONFIGURATION OF DRAM

First, a description will be given of the configuration of the DRAM of the embodiment with reference to FIG. 1, which schematically shows the constitution of a column of the DRAM.

The structure of FIG. 1 includes a column 50, which comprises in this case a memory cell array 61, a sense amplifier array 71, a column decoder array 81, a first transistor coupling section 91 disposed between a pair of bit lines BL and $\overline{BL}$ respectively of the memory cell array 61, and a pair of nodes NA and $\overline{NA}$ of the sense amplifier array 71. A second transistor coupling section 101 is disposed between the sense amplifier nodes and a pair of data buses DB and $\overline{DB}$ so as to be controlled by a column decoder 83 of a column decoder array 81. In this configuration, a plurality of such columns are arranged to form a DRAM in a two-dimensional structure.

In the memory cell array 61, a plurality of word lines are disposed so as to intersect the bit lines BL and $\overline{BL}$ such that memory cells are connected to the respective intersections. Incidentally, the configuration of FIG. 1 includes, for simplicity, only two work lines WLN and WLN+1 and two memory cells MCN and MCN+1.

Furthermore, the sense amplifier array 71 includes a sense amplifier 73 of an n-channel type with two field effect transistors T1 and T2 of an n-type channel. A sense amplifier 75 of a p-type channel is formed with two field effect transistors T3 and T4 of a p-type channel. The transistors T1 and T2 have source electrodes connected via an NMOS field effect transistor 77 to a ground GND; whereas, transistors T3 and T4 possess source electrodes linked via a PMOS field effect transistor 79 to a power source Vcc. In this embodiment, these field effect transistors are formed in an MOS or IGFET structure. For example, the sense amplifier 73 is responsive to a control signal $\phi$ s to discharge the bit line BL or $\overline{BL}$ which indicates a logical value "0" and the sense amplifier node NA or $\overline{NA}$ associated with a logical value "0", precharge potential (VP) to a ground potential, for example. In another example, the sense amplifier 75 is operative in response to a control signal $\phi$ p to charge the sense amplifier node NA, or $\overline{NA}$ indicating a logical value "1", from the potential Vp to the power source potential Vcc for example.

In addition, the first transistor coupling section 91 sets, when the sense amplifiers 73 and 75 are effecting sense operations. A first path in formed between either one of the amplifier nodes NA and $\overline{NA}$ and the corresponding bit line BL and $\overline{BL}$ in a conductive state. A second path is formed between the other amplifier nodes NA and $\overline{NA}$ and the remaining corresponding bit line BL and $\overline{BL}$ in a nonconductive state. Thereafter, the second path is changed from the nonconductive state to the conductive state. In this embodiment, section 91 is constituted with field effect transistors T5 and T6 of an n-type channel having gate electrodes supplied with a common control signal $\phi$ L. The transistor T5 has a drain electrode and a source electrode respectively linked to the bit line BL and the sense amplifier node NA. The transistor T6 inlcudes a drain electrode and a source electrode respectively connected to the bit line $\overline{BL}$ and the sense amplifier node $\overline{NA}$. In this structure, a level of the signal $\phi$ L is changed depending on a predetermined sequence, which will be described later. The change in the level of $\phi$ L varies the impedance of the transistors T5 and T6, which enables the paths between the bit lines and the sense amplifier nodes to reach the desired conductive states. Incidentally, it is assumed in this embodiment that the signal $\phi$ L is produced by a $\phi$ L signal generator circuit 200 of FIG. 1. A description of the $\phi$ L generator circuit 200 will be given later in a section entitled "$\phi$ L signal generating circuit".

In addition, during an amplifying operation of the sense amplifier, the second transistor coupling section 101 causes a path to be established between the pair of sense amplifier nodes NA an $\overline{NA}$ and the pair of data buses DB and $\overline{DB}$ when a path between a sense amplifier node and a bit line in a nonconductive state is turned to a conductive state. In this embodiment, the second transistor coupling section 101 includes field effect transistors T7 and T8 of an n-type channel having gate electrodes commonly connected to the column decoder 83. The transistor T7 has a drain electrode and a source electrode respectively linked to the sense amplifier node NA and the data bus DB. Transistor T8 includes a drain electrode and a source electrode respectively connected to the sense amplifier node $\overline{NA}$ and the data bus $\overline{DB}$. In this configuration, when the gate electrodes of the transistors T7 and T8 are supplied with a high-level signal from the column selector unit, namely, the Y decoder 83, there is selectively established a linked state between the pair of sense amplifier nodes NA and $\overline{NA}$ and the pair of data buses DB and $\overline{DB}$.

DESCRIPTION OF THE OPERATION OF DRAM

Description will next be given of a sense operation of the DRAM in the embodiment above. FIGS. 2A-2J show waveforms useful for understanding the operation of the DRAM.

Let us assume that at time t0, the word line WLN is selected. Electric charge representing information of a memory cell MCN connected to the word line WLN is transferred to the bit line $\overline{BL}$, and hence the potential of the bit line $\overline{BL}$ set to the precharge potential Vp is changed by a potential level equivalent to the charge of information stored in the memory cell MCN. In this situation, since the $\phi$ L signal is at a level of Vcc+Vth+$\alpha$ and the transistors T5 and T6 are in the conductive state, a signal representing information produced in the bit line $\overline{BL}$ is delivered to the sense amplifier node NA, where Vth is a threshold value of the transistors T5 and T6 and $\alpha$ is a positive constant specifically selected to a design of the DRAM circuit.

Figure 2:
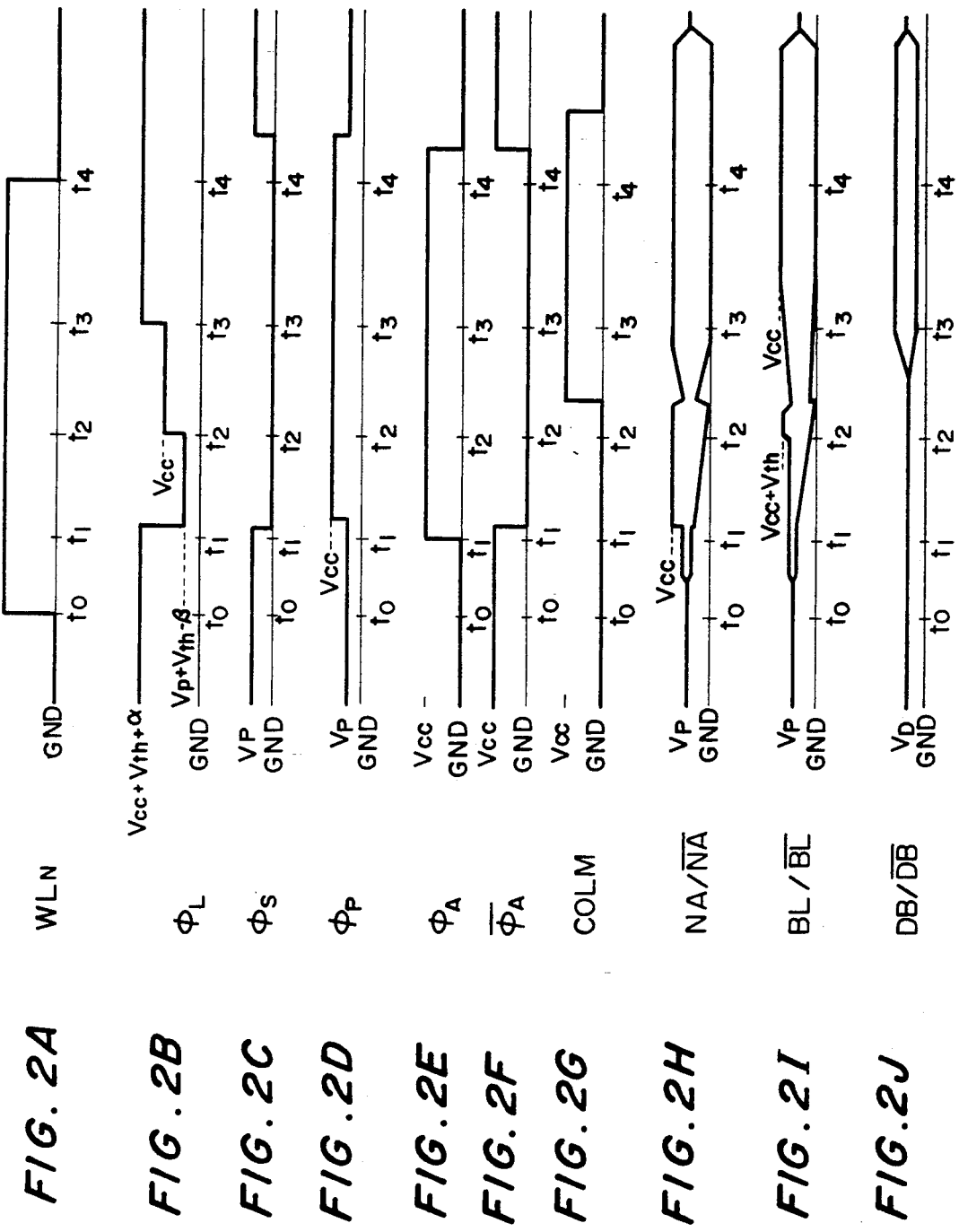
FIGS. 2A–2J are waveforms useful for understanding an operation of the DRAM of the FIG. 1 embodiment.

Subsequently, at time t1, the level of the signal $\phi$ A supplied to the transistor 77 and the level of $\overline{\phi A}$ applied to the gate electrode of transistor 79 are respectively varied as shown in FIGS. 2E and 2F. In response thereto, the level of a sense amplifier drive signal $\phi$ S supplied to the sense amplifier 73 of an n-type channel is changed from Vp to ground level GND as shown in FIG. 2C. Furthermore, the level of a sense amplifier drive signal $\phi$ P applied to the sense amplifier 75 of a p-type channel is altered as shown in FIG. 2D. These acts consequently enable the sense amplifiers 73 and 75 to activate. In addition, at time t1, the level of the signal $\phi$ L is changed from Vcc+Vth+$\alpha$ to a level (represented by VP+Vth−$\beta$) which is lower than VP+Vth and higher than Vth. Value $\beta$ is a positive constant smaller than Vp and specifically selected to a design of the circuit. As a result, there is established a nonconductive state in the transistor T5 or T6 of the first transistor coupling section 91 connected between one of the sense amplifier nodes NA and $\overline{NA}$. The new conductive state indicates a logical value "1", namely, a higher potential, and the corresponding bit lines BL and $\overline{BL}$.

Since the MOS transistors T5 or T6 of an n-type channel between the bit line related to "1" and the sense amplifier node associated with "1" electrically separate a parasitic capacitance CB from a parasitic capacitance CNA, the sense amplifier 75 can rapidly charge up to restore the load thus decreased. As a result, the sense amplifier 75 completes the sense/amplifying operations at a high speed such that the sense amplifier node NA or $\overline{NA}$ reaches a logical level "1" or "0".

On the other hand, since the transistor T5 or T6 between the bit line related to "0" and the sense amplifier node associated with "0" is on, the electric charges on the bit line and the sense amplifier node are discharged through the transistor of an n-type channel having a gate potential set to the full level of "1" in the sense amplifier 73. In this situation, in the sense amplifier 73, the potential of the MOS transistor T1 or T2 of an n-type channel is increased to a high value at a high speed and hence the charge on the bit line related to "0" is discharged in a short period of time.

Subsequently, at time t2 when there appears a sufficient potential difference between the bit lines BL and $\overline{BL}$, the level of signal $\phi$ L is increased to Vcc. This causes a conductive state to take place between the bit line related to "1" and the sense amplifier node associated with "1", and hence the bit line of "1" is finally set to a potential level Vcc−Vth.

After the level of signal $\phi$ L is set to Vcc, the column decoder 83 is set to produce an output COLM at a high level, which turns on the transistors T7 and T8 of the second transistor coupling section 101, transistors 7 and 8 are set to a selected state. In this case, the precharge potential VD of the data bus takes a value between the power source potential Vcc and the ground potential. When the bit line and the sense amplifier node have a potential higher than the precharge potential VD, and they each undergo a discharge operation such that the electric charge flows to the element at the VD level.

When the bit line and the sense amplifier node have a potential lower than the precharge potential VD, they each are charged up toward the VD level. In this situation, however, the gate potential of the transistor T5 or T6 between the bit line and the sense amplifier node each related to "1" is Vcc. When this is compared with a situation where the transistor has the gate potential Vcc+Vth+α, a high impedance appears in the connection state between the bit line and the sense amplifier. The resulting potential decrease of the bit line is considerably smaller than that of the sense amplifier node. This enables the potential of the bit line and the sense amplifier node to be restored at a high speed. Furthermore, since the second transistor coupling section 101 establishes a coupled state between the pair of sense amplifier nodes NA and $\overline{NA}$ and the pair of data buses DB and $\overline{DB}$, information transmission takes place from the sense amplifier nodes to the data buses.

At time t3, the level of signal $\phi$ L is restored from Vcc to Vcc+Vth+α. At this point of time, the sense amplifier nodes are not at the Vcc and ground levels. The bit line related to "1" is at the potential level of Vcc−Vth, which causes the potential of the bit line BL or $\overline{BL}$ to reach Vcc in a short period of time. As a result, it is possible to effect a full-level rewrite operation on the memory cell at the time t3.

Since the potential levels Vcc and GND are established on the bit lines BL and $\overline{BL}$ at time t4, the rewrite operation has been completed on the memory cell. Consequently, the potential of the word line WLN of the memory cell array 61 is lowered to ground so as to complete a sequence of operations including an information read operation from the memory cell and information rewrite operation in the memory cell.

CONTROL SIGNAL GENERATING CIRCUIT

Figure 3:
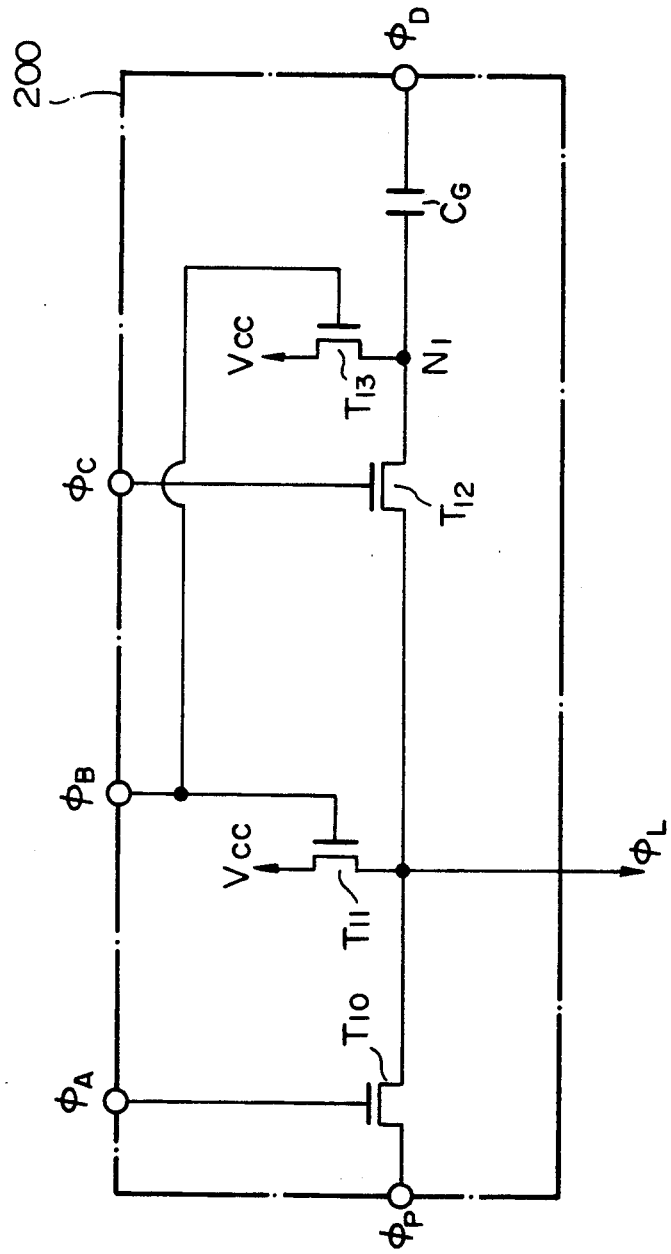
FIG. 3 is a circuit diagram showing an example of a circuit to generate signal $\phi$ L applied to the appropriate embodiment according to the present invention.

As mentioned, signal generating circuit 200 produces the $\phi$ L signal supplied to gate electrodes of the first transistor coupling section 91. FIG. 3 shows a circuit diagram useful for understanding the control signal generating circuit 200. FIGS. 4A–4I plot waveforms related to operations of the control signal generating circuit 200.

Circuit 200 includes a field effect transistor T10 of an n-type channel controlled by the signal $\phi$ A controlling the sense amplifier 73. The source-drain path of transistor T10 couples a $\phi$ P signal line to a $\phi$ L signal line. A field effect transistor T11 of an n-type channel is controlled by a signal $\phi$ B for precharging the $\phi$ L signal line to the Vcc level. A field effect transistor T12 of an n-type channel is controlled by a signal $\phi$ C for coupling a node N1 to the $\phi$ L signal line so as to supply the $\phi$ L signal line with a potential level Vcc+Vth+α (where, Vth is a threshold value of the transistor of an n-type channel and α≧0). A field effect transistor T13 of an n-type channel is coupled for precharging the node N1 to the Vcc level. A capacitor CG has a an electrode connected to the node N1 and another electrode connected to a $\phi$ D signal supply terminal for effecting a bootstrap operation under the control of the $\phi$ D signal to set the node N1 to the potential level Vcc+Vth+α.

The control signal generating circuit 200 conducts operations as follows. In the description, the points of time t1, t2, and t3 respectively correspond to those of FIGS. 2A-2J employed in the description of the DRAM of the embodiment.

At time t1, in order to change the signal level of the signals $\phi$ L from Vcc+Vth+α to a level not exceeding VP+Vth, the signal $\phi$ c and $\phi$ D are subjected to negative-going transitions so as to establish a nonconductive state between the node N1, which serves as a source of the potential level Vcc+Vth+α of the signal $\phi$ L, and the $\phi$ L signal line.

Almost simultaneously with the time t1., the $\phi$ A signal changes positively to set transistor T10 conductive to interconnect the $\phi$ L signal line and the $\phi$ P signal line. A charge distribution is again effected on the charges loaded on the $\phi$ P signal line and the $\phi$ L signal line, as shown in FIG. 4A. As a result, the potential of the $\phi$ L signal line is set to a potential level not exceeding VP+Vth, as shown in FIG. 4I.

Subsequently, at the time t2, in order to precharge the $\phi$ L signal line and the node N1 to a potential level Vcc, the $\phi$ B signal undergoes a positive-going transition so as to develop Vcc+Vth+α, as shown in FIG. 4E.

At the time t3, when the $\phi$ B signal is caused to fall down and the potential levels of the signals $\phi$ C and $\phi$ D are increased to Vcc+Vth+α and Vcc, respectively, the potential of the $\phi$ L signal line is changed to a potential level Vcc+Vth+α.

ALTERNATIVE EMBODIMENT

The present invention is not restricted by the embodiment above but there can be made various modifications thereof.

Although the first embodiment described above includes the first and second transistor coupling sections respectively comprising two field effect transistors of an n-type channel; these transistor coupling sections may be implemented in other suitable configurations. For example, in place of the field effect transistors of the respective sections, there may be adopted PMOS transistors such that the polarities of the signals supplied to the transistor coupling sections are reversed to those of the first embodiment.

In addition, the control signal generating circuit 200 is not limited to the configuration shown in FIG. 3. Other suitable configurations may be employed therefor.

As can be seen from the description above, according to the DRAM of this embodiment, in a sense operation (at the time t1 in the embodiment), since a nonconductive state is established between the one of the bit lines and the one of the sense amplifier nodes, the sense operation can be accomplished in a state free from an influence of capacitance of the bit line, which in consequence enables the sense operation to be effected at a high speed. When the sense operation is effected, the potential of the sense amplifier node associated with the level "1" easily reaches the full level.

Furthermore, in the amplification operation of the sense amplifier, there is set a conductive state between one of the bit lines related to the level "0" and one of the sense amplifier nodes which is driven to the level "0". Moreover, in the pair of sense amplifiers, since the gate electrode potential of the field effect transistor conducting a discharge of the sense node related to the level "0" has reached the full level of "1", the discharge period of time associated with the bit line is minimized from the conventional case.

In addition, in order to prevent a potential drop in the bit line when the second transistor coupling section links the pair of sense amplifier nodes and the pair of data buses to transfer information to the data buses and when the potential level of the signal $\phi L$ is increased to $Vcc + Vth + \alpha$ to effect a full-level rewrite operation on the memory cell, if the nonconductive path between the sense amplifier nodes and the bit lines are changed to a conductive state (at the time t2 in the embodiment), the potential of the gate electrode undergoes a slight change from a predetermined value not exceeding $VP + Vth$ to Vcc. In consequence, in a state where the level of the sense amplifier node related to the level "1" is substantially kept unchanged, the bit line on the level of "1" can be charged up from the VP level to the $Vcc - Vth$ level.

In addition, thereafter, the second transistor coupling section establishes a linkage between the pair of sense amplifier nodes and the pair of data buses. In this situation, since there exists a high impedance state between the bit line related to "1" and the sense amplifier node associated with "1", the potential drop of th bit line is smaller than that of the sense amplifier node and hence the potential is rapidly restored in the bit line and the sense amplifier node, which enables the information transmission and data access to be achieved at a high speed.

While the present invention has been described with reference to the particular illustrative embodiment, it is not to be restricted by the embodiment but only by the appended claims. It is to be appreciated that those skilled in the art can change or modify the embodiment without departing from the scope and spirit of the present invention.

What is claimed is:

1. An integrated circuit memory device comprising:
   a memory cell for storing data therein in the form of either a logic ONE or ZERO level;
   a sense amplifier having first and second sense amplifier nodes for sensing the data stored in said memory cell in a sense operation;
   a word line for selecting said memory cell at a given time prior to the sense operation;
   a pair of first and second bit lines on which a potential is maintained at a predetermined precharge potential substantially in the middle of a power source potential level and a ground potential level prior to the given time;
   said memory cell being coupled to said first bit line to change the potential on said first bit line from the predetermined precharge potential in accordance with the data stored therein when said memory cell is selected by said word line;
   a first transistor for selectively coupling said first bit line with said first sense amplifier node, said first transistor having a first gate electrode and having a potential threshold;
   a second transistor for selectively coupling said second bit line with said second sense amplifier node, said second transistor having a second gate electrode and having said potential threshold; and
   a voltage applying circuit for commonly applying a first voltage to the first and second gate electrodes, the first voltage having a magnitude, less than the power source potential level and between a potential corresponding to said potential threshold and a potential equal to the sum of the potential corresponding to said potential threshold and the precharge potential at the beginning of the sense operation, so that said first transistor is operative to decouple the first sense amplifier node from said first bit line when said memory cell stores the logic ONE level while said second transistor connects the second sense amplifier node with said second bit line, and said second transistor is operative to decouple the second sense amplifier node from said second bit line when said memory cell stores the logic ZERO level while said first transistor connects the first sense amplifier node with said first bit line.

2. The memory device according to claim 1 wherein said voltage applying means commonly applies a second voltage to the first and second gate electrodes after the given time and prior to the sense operation to cause said first and second transistors to transfer the potential on said first and second bit lines to the first and second sense nodes, respectively.

3. The memory device according to claim 1 wherein said first transistor comprises a field effect transistor having a drain electrode connected to one of said pair of bit lines, and a source electrode connected to one of the first and second sense nodes.

4. A memory device according to claim 1 wherein said second transistor comprises a second field effect transistor having a drain electrode connected to one of said pair of bit lines, and a source electrode connected to one of said first and second sense nodes.

5. A memory device in accordance with claim 1 wherein a first transistor coupling circuit is connected between said pair of bit lines and said first and second sense nodes, with each bit line being connected to said memory cell to comprise a column, such that a conductive state may be selectively set between said bit lines and said sense nodes in response to a first signal.

6. A memory device according to claim 1 wherein a second transistor coupling circuit is connected between a pair of data buses and said first and second sense nodes to respond to a second control signal in order to select a column for establishing a conductive state between said pair of data buses and said pair of sense nodes.

7. The memory device of claim 1 wherein said memory cell comprises a dynamic random access memory (DRAM) cell.

8. An integrated circuit memory device comprising:
a memory cell for storing data therein in the form of either a logic ONE or ZERO level;
a sense amplifier having first and second sense amplifier nodes for sensing the data stored in said memory cell in a sense operation;
a word line for selecting said memory cell at a given time prior to the sense operation;
a pair of first and second bit lines, on which a potential is maintained at a predetermined precharge potential substantially in the middle of a power source potential level and a ground potential level prior to said given time;
said memory cell being coupled to said first bit line to change the potential on said first bit line from the predetermined precharge potential, in accordance with the data stored therein when said memory cell is selected by said word line;
a first transistor for selectively coupling said first bit line with the first sense amplifier node, said first transistor having a first gate electrode and having a potential threshold;
a second transistor for selectively coupling said second bit line with the second sense amplifier node, said second transistor having a second gate electrode and having said potential threshold; and
a control circuit for commonly controlling said first and second transistors at a beginning of the sense operation so that said first transistors is operative to decouple the first sense node from said first bit line when said memory cell stores the logic ONE level while said second transistor connects the second sense amplifier node with said second bit line, and said second transistor is operative to decouple the second sense node from said second bit line when said memory cell stores the logic ZERO level while said first transistor connects the first sense amplifier node with said first bit line.

9. The memory device according to claim 8 wherein said first transistor comprises a field effect transistor having a drain electrode connected to one of said pair of bit lines, and a source electrode connected to one of the first and second sense nodes.

10. A memory device according to claim 8 wherein said second transistor comprises a second field effect transistor having a drain electrode connected to one of said pair of bit lines, and a source electrode connected to one of said first and second sense nodes.

11. The memory device of claim 8 wherein said memory cell comprises a dynamic random access memory (DRAM) cell.

* * * * *